US011315787B2

(12) United States Patent
Yang et al.

(10) Patent No.: US 11,315,787 B2
(45) Date of Patent: Apr. 26, 2022

(54) MULTIPLE SPACER PATTERNING SCHEMES

(71) Applicant: Applied Materials, Inc., Santa Clara, CA (US)

(72) Inventors: Tzu-shun Yang, Milpitas, CA (US); Rui Cheng, Santa Clara, CA (US); Karthik Janakiraman, San Jose, CA (US); Zubin Huang, Santa Clara, CA (US); Diwakar Kedlaya, Santa Clara, CA (US); Meenakshi Gupta, San Jose, CA (US); Srinivas Guggilla, San Jose, CA (US); Yung-chen Lin, Gardena, CA (US); Hidetaka Oshio, Tokyo (JP); Chao Li, Santa Clara, CA (US); Gene Lee, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/821,759

(22) Filed: Mar. 17, 2020

(65) Prior Publication Data
US 2020/0335338 A1 Oct. 22, 2020

Related U.S. Application Data

(60) Provisional application No. 62/835,290, filed on Apr. 17, 2019.

(51) Int. Cl.
*H01L 21/033* (2006.01)
*H01L 21/311* (2006.01)
*H01L 21/3213* (2006.01)

(52) U.S. Cl.
CPC ...... *H01L 21/0338* (2013.01); *H01L 21/0337* (2013.01); *H01L 21/31138* (2013.01); *H01L 21/32137* (2013.01)

(58) Field of Classification Search
CPC ............... H01L 21/32137; H01L 21/0338
See application file for complete search history.

(56) References Cited

U.S. PATENT DOCUMENTS 7,294,581 B2  11/2007  Iyer et al.
7,811,924 B2  10/2010  Cui et al.
(Continued)

OTHER PUBLICATIONS

A. Raley, A spacer-on-spacer scheme for self-aligned multiple patterning and integration, Aug. 2016, https://spie.org/news/6583-a-spacer-on-spacer-scheme-for-self-aligned-multiple-patterning-and-integration.

(Continued)

*Primary Examiner* — Alia Sabur
(74) *Attorney, Agent, or Firm* — Patterson + Sheridan, LLP

(57) ABSTRACT

The present disclosure provides forming nanostructures utilizing multiple patterning process with good profile control and feature transfer integrity. In one embodiment, a method for forming features on a substrate includes forming a mandrel layer on a substrate, conformally forming a spacer layer on the mandrel layer, wherein the spacer layer is a doped silicon material, and patterning the spacer layer. In another embodiment, a method for forming features on a substrate includes conformally forming a spacer layer on a mandrel layer on a substrate, wherein the spacer layer is a doped silicon material, selectively removing a portion of the spacer layer using a first gas mixture, and selectively removing the mandrel layer using a second gas mixture different from the first gas mixture.

14 Claims, 7 Drawing Sheets

(56) References Cited

U.S. PATENT DOCUMENTS

| | | |
|---|---|---|
| 9,123,776 B2 | 9/2015 | Tsai et al. |
| 9,257,293 B2 | 2/2016 | Posseme et al. |
| 9,269,590 B2 | 2/2016 | Luere et al. |
| 9,548,201 B2 | 1/2017 | Zhang et al. |
| 9,698,015 B2 | 7/2017 | Nemani |
| 9,892,917 B2 | 2/2018 | Swaminathan et al. |
| 10,510,540 B2 | 12/2019 | Zhang et al. |
| 2003/0113663 A1* | 6/2003 | Kobayashi ............ G03F 7/0382 430/270.1 |
| 2004/0063328 A1* | 4/2004 | Wen ................. H01L 21/32137 438/706 |
| 2014/0349490 A1 | 11/2014 | Kim et al. |
| 2016/0293420 A1* | 10/2016 | Tang .................. H01L 21/3086 |
| 2018/0076042 A1* | 3/2018 | Cheng ............... H01L 21/28525 |
| 2018/0323061 A1 | 11/2018 | Raley et al. |
| 2019/0295906 A1* | 9/2019 | Clark ..................... H01L 22/26 |

OTHER PUBLICATIONS

A. Jacob., Scaling challenges for Advanced CMOS Devices, Mar. 2017, https://www.researchgate.net/figure/a-Simulation-images-of-the-stages-of-self-aligned-quadruple-patterning-SAQP-from_fig39_313845174.

\* cited by examiner

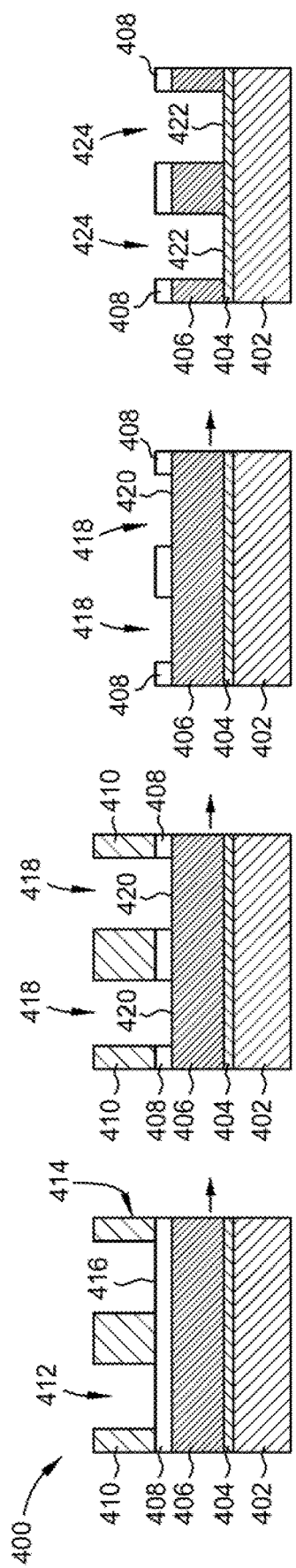

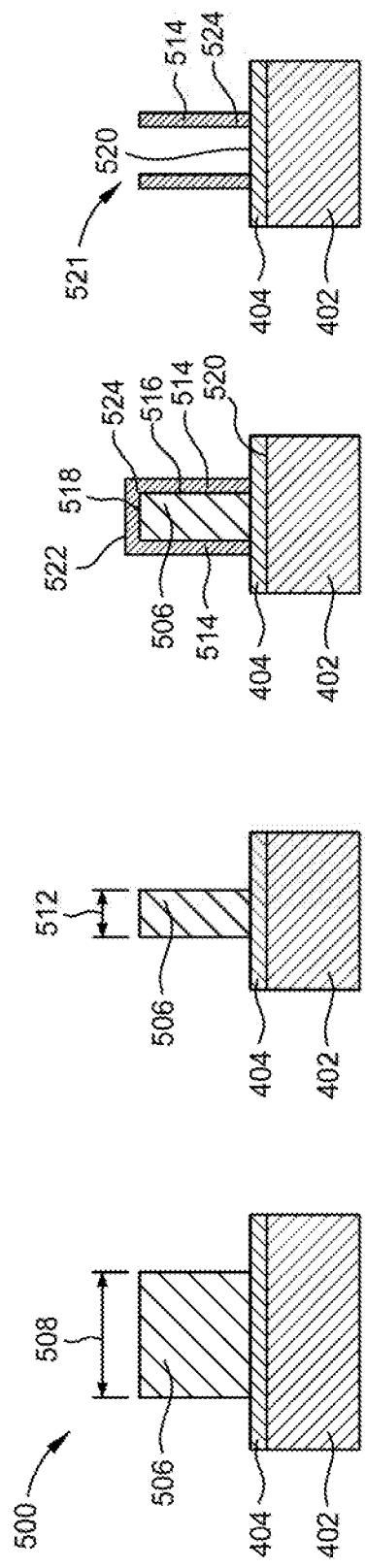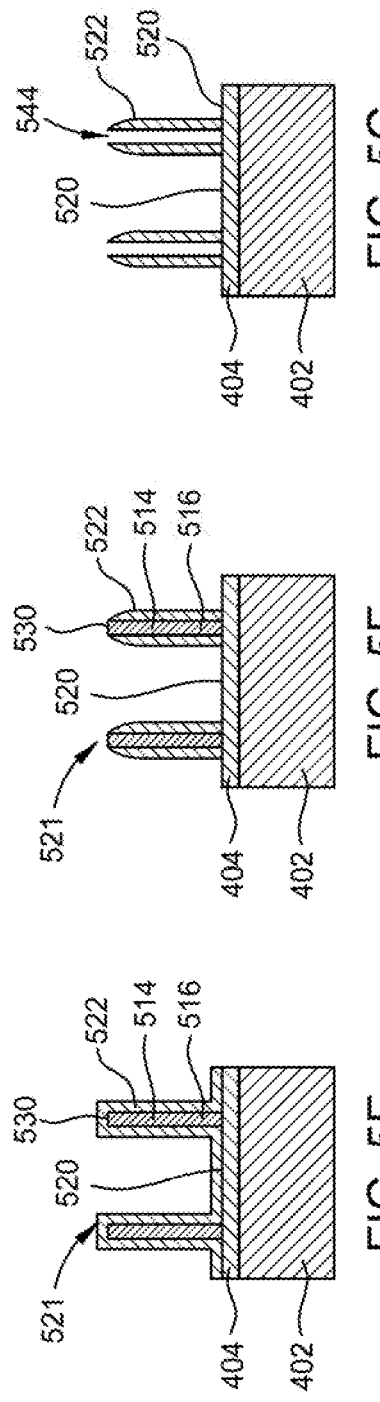

MULTIPLE SPACER PATTERNING SCHEMES

CROSS-REFERENCE TO RELATED APPLICATIONS

This application claims benefit of U.S. Provisional Application Ser. No. 62/835,290, filed Apr. 17, 2019, of which is incorporated by reference in its entirety.

BACKGROUND

Field

Examples of the present disclosure generally relate to forming nanostructures in a film layer. Particularly, embodiments of the present disclosure provide methods for forming features with small dimensions with precision dimension control and minimum lithographic related errors.

Description of the Related Art

In the manufacture of integrated circuits (IC), or chips, patterns representing different layers of the chip are created by a chip designer. A series of reusable masks, or photomasks, are created from these patterns in order to transfer the design of each chip layer onto a semiconductor substrate during the manufacturing process. Mask pattern generation systems use precision lasers or electron beams to image the design of each layer of the chip onto a respective mask. The masks are then used much like photographic negatives to transfer the circuit patterns for each layer onto a semiconductor substrate. These layers are built up using a sequence of processes and translate into the tiny transistors and electrical circuits that comprise each completed chip. Thus, any defects in the mask may be transferred to the chip, potentially adversely affecting performance. Defects that are severe enough may render the mask completely useless. Typically, a set of 15 to 100 masks is used to construct a chip and can be used repeatedly.

With the shrink of critical dimensions (CD), present optical lithography is approaching a technological limit at the 45 nanometer (nm) technology node. Next generation lithography (NGL) is expected to replace the conventional optical lithography method, for example, in the 32 nm technology node and beyond. The images of the patterned mask are projected through the high-precision optical system onto the substrate surface, which is coated with a layer of photoresist layer. The patterns are then formed on the substrate surface after complex chemical reactions and follow-on manufacturing steps, such as development, post-exposure bake and wet or dry etching.

Multiple patterning technique is a technology developed for photolithography to enhance the feature density. A simple example for utilizing the multiple patterning technique is double patterning, where a conventional lithography process is enhanced to produce double the expected number of features. Double exposure is a sequence of two separate exposures of the same photoresist layer using two different photomasks. This technique is commonly used for patterns in the same layer which look very different or have incompatible densities or pitches.

Double patterning lithography (DPL) is an effective technique to improve resolution. DPL theoretically doubles resolution through pitch splitting. DPL involves two separate exposures and etch steps (litho-etch-litho-etch, or called LELE or L2E2). DPL is particularly suitable for 20 nm generation technology and is one of the promising candidate solutions for scaling down to 14 nm technology and beyond. In some structures that require feature pitch down under 10 nm, higher number of the patterning technique, such as quadruple patterning or octuple patterning (L4E4 or L8E8), may be required to push the dimension limit. However, as the geometry limits of the structures used to form semiconductor devices are pushed against technology limits, the need for accurate formation during the multiple patterning process has become increasingly difficult to satisfy. Poor profile control occurred during the patterning process often result in defects, such as footing structure, corner rounding, poor line integrity or pitch dimension inaccurate, found on the transferred features, thus eventually leading device failure. Thus, the need for accurate process control for the manufacture of small critical dimensional structures during the multiple patterning has become increasingly important.

Therefore, there is a need for forming nanostructures with precision dimension control.

SUMMARY

The present disclosure provides forming nanostructures utilizing multiple patterning process with good profile control and feature transfer integrity. In one embodiment, a method for forming features on a substrate includes forming a mandrel layer on a substrate, conformally forming a spacer layer on the mandrel layer, wherein the spacer layer is a doped silicon material, and patterning the spacer layer.

In another embodiment, a method for forming features on a substrate includes conformally forming a spacer layer on a mandrel layer on a substrate, wherein the spacer layer is a doped silicon material, selectively removing a portion of the spacer layer using a first gas mixture, and selectively removing the mandrel layer using a second gas mixture different from the first gas mixture.

In yet another embodiment, a method for forming features on a substrate includes conformally forming a spacer layer on a mandrel layer on a substrate, wherein the spacer layer is a doped silicon material, wherein the mandrel layer is fabricated from an organic material that sustains under a thermal process up to 200 degrees Celsius, selectively removing a portion of the spacer layer using a first gas mixture, and selectively removing the mandrel layer using a second gas mixture different from the first gas mixture.

BRIEF DESCRIPTION OF THE DRAWINGS

So that the manner in which the above recited features of embodiments of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 4A-4I depict one example of cross sectional views of a sequence for forming a nanostructure by the method of FIG. 3 in accordance with one embodiment of the present disclosure;

FIGS. 5A-5G depict one example of cross sectional views of a sequence for forming a nanostructure by the method of FIG. 3 in accordance with one embodiment of the present disclosure.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Methods for manufacturing nanostructures with desired small dimensions, less than 14 nanometers or beyond, are provided. The methods utilize multiple spacer patterning (SAMSP) process to transfer features with small dimensions to a mask layer that may be used in an etching process to further transfer features into a material layer disposed underneath the mask layer. In one example, a spacer layer is utilized during the multiple patterning processes. The spacer layer may be manufactured by a doped silicon containing material.

Figure 1:
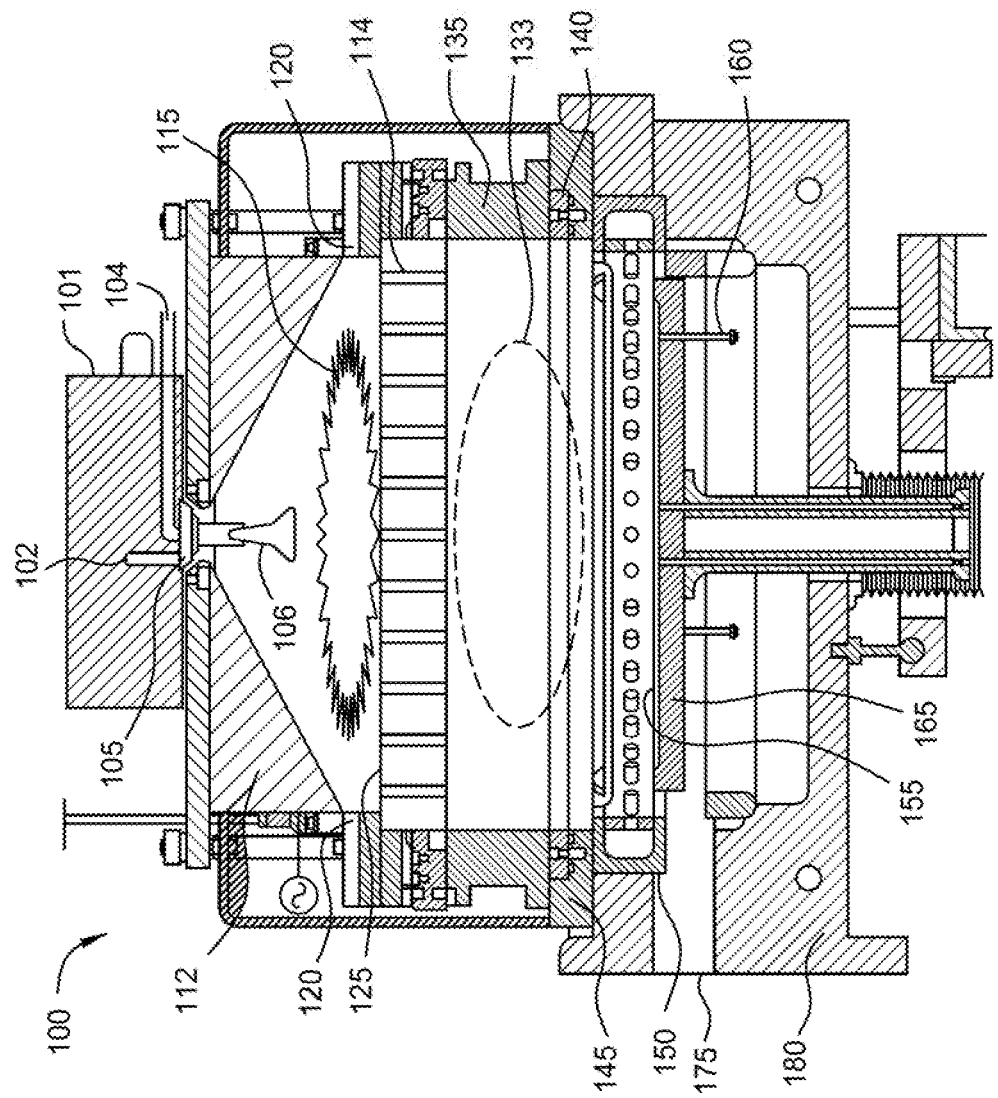
FIG. 1 depicts a processing chamber that may be utilized to perform a deposition process in accordance with one embodiment of the present disclosure.

FIG. 1 is a cross-sectional view of one embodiment of a flowable chemical vapor deposition chamber 100 with partitioned plasma generation regions. The flowable chemical vapor deposition chamber 100 may be utilized to deposit a flowable silicon containing layer, such as a doped silicon containing layer, onto a substrate. Other flowable silicon containing layers may include silicon oxide, silicon carbide, silicon nitride, silicon oxynitride or silicon oxycarbide, among others. During film deposition, a process gas may be flowed into a first plasma region 115 through a gas inlet assembly 105. The process gas may be excited prior to entering the first plasma region 115 within a remote plasma system (RPS) 101. The deposition chamber 100 includes a lid 112 and showerhead 125. The lid 112 is depicted with an applied AC voltage source and the showerhead 125 is grounded, consistent with plasma generation in the first plasma region 115. An insulating ring 120 is positioned between the lid 112 and the showerhead 125 enabling a capacitively coupled plasma (CCP) to be formed in the first plasma region 115. The lid 112 and showerhead 125 are shown with an insulating ring 120 in between, which allows an AC potential to be applied to the lid 112 relative to the showerhead 125.

The lid 112 may be a dual-source lid featuring two distinct gas supply channels within the gas inlet assembly 105. A first gas supply channel 102 carries a gas that passes through the remote plasma system (RPS) 101, while a second gas supply channel 104 bypasses the RPS 101. The first gas supply channel 102 may be used for the process gas and the second gas supply channel 104 may be used for a treatment gas. The gases that flow into the first plasma region 115 may be dispersed by a baffle 106.

A fluid, such as a precursor, may be flowed into a second plasma region 133 of the deposition chamber 100 through the showerhead 125. Excited species derived from the precursor in the first plasma region 115 travel through apertures 114 in the showerhead 125 and react with the precursor flowing into the second plasma region 133 from the showerhead 125. Little or no plasma is present in the second plasma region 133. Excited derivatives of the precursor combine in the second plasma region 133 to form a flowable dielectric material on the substrate. As the dielectric material grows, more recently added material possesses a higher mobility than underlying material. Mobility decreases as organic content is reduced by evaporation. Gaps may be filled by the flowable dielectric material using this technique without leaving traditional densities of organic content within the dielectric material after deposition is completed. A curing step may still be used to further reduce or remove the organic content from the deposited film.

Exciting the precursor in the first plasma region 115 alone or in combination with the remote plasma system (RPS) 101 provides several benefits. The concentration of the excited species derived from the precursor may be increased within the second plasma region 133 due to the plasma in the first plasma region 115. This increase may result from the location of the plasma in the first plasma region 115. The second plasma region 133 is located closer to the first plasma region 115 than the remote plasma system (RPS) 101, leaving less time for the excited species to leave excited states through collisions with other gas molecules, walls of the chamber and surfaces of the showerhead.

The uniformity of the concentration of the excited species derived from the precursor may also be increased within the second plasma region 133. This may result from the shape of the first plasma region 115, which is more similar to the shape of the second plasma region 133. Excited species created in the remote plasma system (RPS) 101 travel greater distances in order to pass through apertures 114 near the edges of the showerhead 125 relative to species that pass through apertures 114 near the center of the showerhead 125. The greater distance results in a reduced excitation of the excited species and, for example, may result in a slower growth rate near the edge of a substrate. Exciting the precursor in the first plasma region 115 mitigates this variation.

In addition to the precursors, there may be other gases introduced at different times for various purposes. For example, a treatment gas may be introduced to remove unwanted species from the chamber walls, the substrate, the deposited film and/or the film during deposition. The treatment gas may comprise at least one or more of the gases selected from the group comprising of $H_2$, an $H_2/N_2$ mixture, $NH_3$, $NH_4OH$, $O_3$, $O_2$, $H_2O_2$ and water vapor. The treatment gas may be excited in a plasma, and then used to reduce or remove a residual organic content from the deposited film. In other example, the treatment gas may be used without a plasma. When the treatment gas includes water vapor, the delivery may be achieved using a mass flow meter (MFM) and injection valve, or by utilizing other suitable water vapor generators.

In the embodiment, the doped silicon containing layer can be deposited by introducing silicon containing precursors and reacting processing precursors in the second plasma region 133. Examples of dielectric material precursors are silicon-containing precursors including silane, disilane, methylsilane, dimethylsilane, trimethylsilane, tetramethylsilane, tetraethoxysilane (TEOS), triethoxysilane (TES), octamethylcyclotetrasiloxane (OMCTS), tetramethyl-disiloxane (TMDSO), tetramethylcyclotetrasiloxane (TMCTS), tetramethyl-diethoxyl-disiloxane (TMDDSO), dimethyl-dimethoxyl-silane (DMDMS) or combinations thereof. Additional precursors for the deposition of silicon nitride include $Si_xN_yH_z$-containing precursors, such as sillyl-amine and its derivatives including trisillylamine (TSA) and disillylamine (DSA), $Si_xN_yH_zO_{zz}$-containing precursors, $Si_xN_yH_zCl_{zz}$-containing precursors, or combinations thereof.

Processing precursors include boron-containing compounds, hydrogen-containing compounds, oxygen-containing compounds, nitrogen-containing compounds, or combinations thereof. Suitable examples of the boron-containing compounds include $BH_3$, $B_2H_6$, $BF_3$, $BCl_3$ and the like. Examples of suitable processing precursors include one or more of compounds selected from the group comprising of $H_2$, a $H_2/N_2$ mixture, $NH_3$, $NH_4OH$, $O_3$, $O_2$, $H_2O_2$, $N_2$, $N_xH_y$ compounds including $N_2H_4$ vapor, NO, $N_2O$, $NO_2$, water vapor, or combinations thereof. The processing precursors may be plasma exited, such as in the RPS unit, to include N* and/or H* and/or O*-containing radicals or plasma, for example, $NH_3$, $NH_2$*, NH*, N*, H*, O*, N*O*, or combinations thereof. The process precursors may alternatively, include one or more of the precursors described herein.

The processing precursors may be plasma excited in the first plasma region 115 to produce process gas plasma and radicals including B*, N* and/or H* and/or O* containing radicals or plasma, or combinations thereof. Alternatively, the processing precursors may already be in a plasma state after passing through a remote plasma system prior to introduction to the first plasma region 115.

The excited processing precursor 190 is then delivered to the second plasma region 133 for reaction with the precursors though apertures 114. Once in the processing volume, the processing precursor may mix and react to deposit the dielectric materials on the substrate.

In one embodiment, the flowable CVD process performed in the deposition chamber 100 may deposit the doped silicon containing gas, such as boron (B) doped silicon layer (Si—B) or other suitable boron-silicon containing material as needed.

Figure 2:
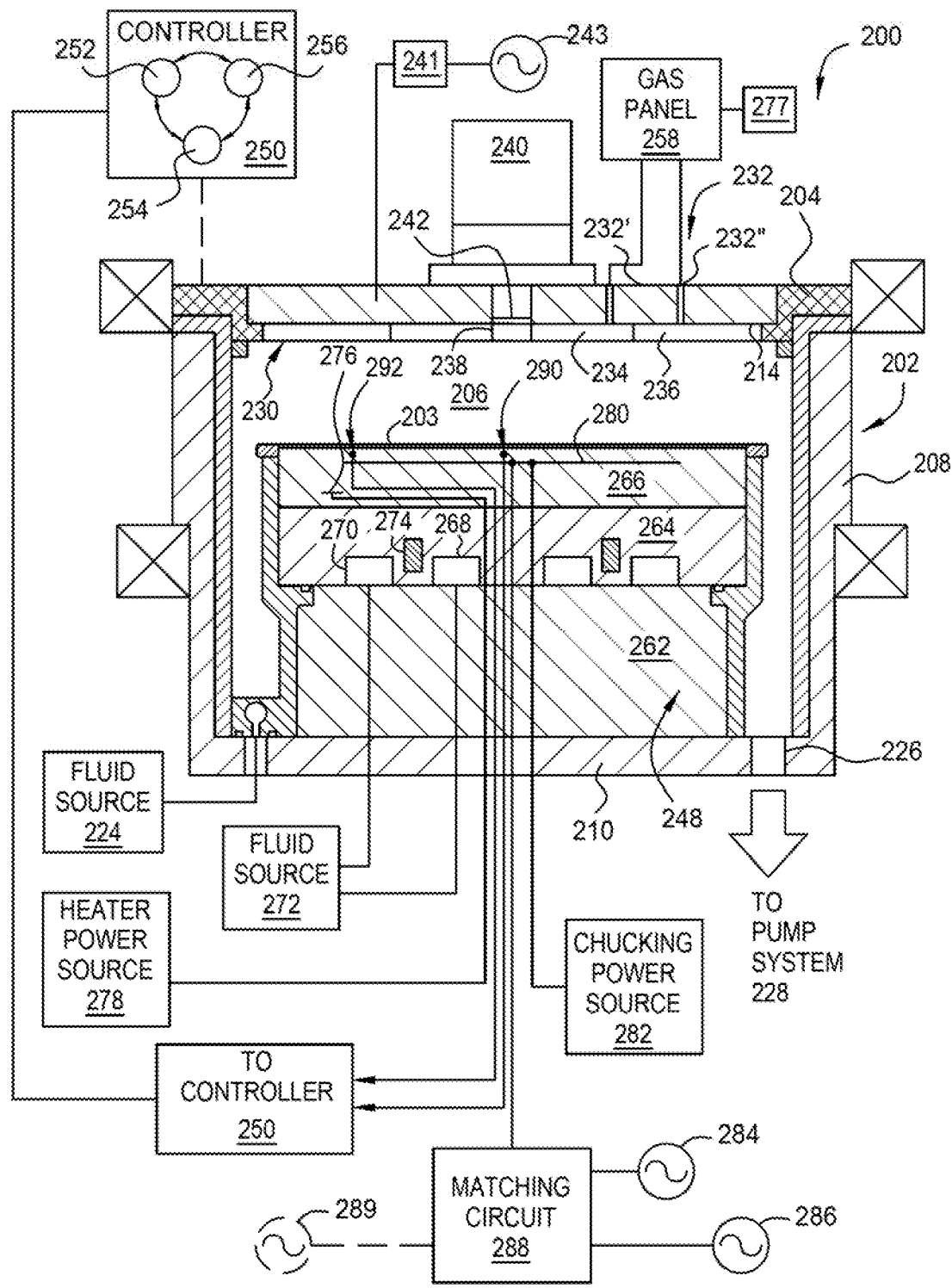
FIG. 2 depicts a processing chamber that may be utilized to perform an etching process in accordance with one embodiment of the present disclosure.

FIG. 2 is a sectional view of one example of a processing chamber 200 suitable for performing a patterning process to etch a spacer layer, such as a doped silicon containing material, along with a hardmask layer on a substrate using an etching process, such as both anisotropic etching and isotropic etching. Suitable processing chambers that may be adapted for use with the teachings disclosed herein include, for example, an ENABLER® or C3® processing chamber available from Applied Materials, Inc. of Santa Clara, Calif. Although the processing chamber 200 is shown including a plurality of features that enable superior etching performance, it is contemplated that other processing chambers may be adapted to benefit from one or more of the inventive features disclosed herein.

The processing chamber 200 includes a chamber body 202 and a lid 204 which enclose an interior volume 206. The chamber body 202 is typically fabricated from aluminum, stainless steel or other suitable material. The chamber body 202 generally includes sidewalls 208 and a bottom 210. A substrate support pedestal access port (not shown) is generally defined in a sidewall 208 and a selectively sealed by a slit valve to facilitate entry and egress of a substrate 203 from the processing chamber 200. An exhaust port 226 is defined in the chamber body 202 and couples the interior volume 206 to a pump system 228. The pump system 228 generally includes one or more pumps and throttle valves utilized to evacuate and regulate the pressure of the interior volume 206 of the processing chamber 200. In one implementation, the pump system 228 maintains the pressure inside the interior volume 206 at operating pressures typically between about 10 mTorr to about 500 Torr.

The lid 204 is sealingly supported on the sidewall 208 of the chamber body 202. The lid 204 may be opened to allow excess to the interior volume 206 of the processing chamber 200. The lid 204 includes a window 242 that facilitates optical process monitoring. In one implementation, the window 242 is comprised of quartz or other suitable material that is transmissive to a signal utilized by an optical monitoring system 240 mounted outside the processing chamber 200.

The optical monitoring system 240 is positioned to view at least one of the interior volume 206 of the chamber body 202 and/or the substrate 203 positioned on a substrate support pedestal assembly 248 through the window 242. In one embodiment, the optical monitoring system 240 is coupled to the lid 204 and facilitates an integrated deposition process that uses optical metrology to provide information that enables process adjustment to compensate for incoming substrate pattern feature inconsistencies (such as thickness, and the like), provide process state monitoring (such as plasma monitoring, temperature monitoring, and the like) as needed. One optical monitoring system that may be adapted to benefit from the disclosure is the EyeD® full-spectrum, interferometric metrology module, available from Applied Materials, Inc., of Santa Clara, Calif.

A gas panel 258 is coupled to the processing chamber 200 to provide process and/or cleaning gases to the interior volume 206. In the example depicted in FIG. 2, inlet ports 232', 232" are provided in the lid 204 to allow gases to be delivered from the gas panel 258 to the interior volume 206 of the processing chamber 200. In one implementation, the gas panel 258 is adapted to provide fluorinated process gas through the inlet ports 232', 232" and into the interior volume 206 of the processing chamber 200. In one implementation, the process gas provided from the gas panel 258 includes at least a fluorinated gas, chlorine, and a carbon containing gas, an oxygen gas, a nitrogen containing gas and a chlorine containing gas. Examples of fluorinated and carbon containing gases include $CHF_3$, $CH_2F_2$ and $CF_4$. Other fluorinated gases may include one or more of $C_2F$, $C_4F_6$, $C_3F_8$ and $C_5F_8$. Examples of the oxygen containing gas include $O_2$, $CO_2$, CO, $N_2O$, $NO_2$, $O_3$, $H_2O$, and the like. Examples of the nitrogen containing gas include $N_2$, $NH_3$, $N_2O$, $NO_2$ and the like. Examples of the chlorine containing gas include HCl, $C_{12}$, $CC_{14}$, $CHCl_3$, $CH_2C_{12}$, $CH_3Cl$, and the like. Suitable examples of the carbon containing gas include methane ($CH_4$), ethane ($C_2H_6$), ethylene ($C_2H_4$), and the like.

A showerhead assembly 230 is coupled to an interior surface 214 of the lid 204. The showerhead assembly 230 includes a plurality of apertures that allow the gases flowing through the showerhead assembly 230 from the inlet ports 232', 232" into the interior volume 206 of the processing chamber 200 in a predefined distribution across the surface of the substrate 203 being processed in the processing chamber 200.

A remote plasma source 277 may be optionally coupled to the gas panel 258 to facilitate dissociating gas mixture from a remote plasma prior to entering into the interior volume 206 for processing. A RF source power 243 is coupled through a matching network 241 to the showerhead assembly 230. The RF source power 243 typically is capable of producing up to about 3000 W at a tunable frequency in a range from about 50 kHz to about 200 MHz.

The showerhead assembly 230 additionally includes a region transmissive to an optical metrology signal. The optically transmissive region or passage 238 is suitable for allowing the optical monitoring system 240 to view the interior volume 206 and/or the substrate 203 positioned on the substrate support pedestal assembly 248. The passage 238 may be a material, an aperture or plurality of apertures formed or disposed in the showerhead assembly 230 that is substantially transmissive to the wavelengths of energy generated by, and reflected back to, the optical monitoring system 240. In one embodiment, the passage 238 includes a window 242 to prevent gas leakage through the passage 238. The window 242 may be a sapphire plate, quartz plate or other suitable material. The window 242 may alternatively be disposed in the lid 204.

In one implementation, the showerhead assembly 230 is configured with a plurality of zones that allow for separate control of gas flowing into the interior volume 206 of the processing chamber 200. In the example illustrated in FIG. 2, the showerhead assembly 230 as an inner zone 234 and an outer zone 236 that are separately coupled to the gas panel 258 through separate inlet ports 232', 232".

The substrate support pedestal assembly 248 is disposed in the interior volume 206 of the processing chamber 200 below the gas distribution (showerhead) assembly 230. The substrate support pedestal assembly 248 holds the substrate 203 during processing. The substrate support pedestal assembly 248 generally includes a plurality of lift pins (not shown) disposed therethrough that are configured to lift the substrate 203 from the substrate support pedestal assembly 248 and facilitate exchange of the substrate 203 with a robot (not shown) in a conventional manner. An inner liner 218 may closely circumscribe the periphery of the substrate support pedestal assembly 248.

In one implementation, the substrate support pedestal assembly 248 includes a mounting plate 262, a base 264 and an electrostatic chuck 266. The mounting plate 262 is coupled to the bottom 210 of the chamber body 202 includes passages for routing utilities, such as fluids, power lines and sensor leads, among others, to the base 264 and the electrostatic chuck 166. The electrostatic chuck 266 comprises at least one clamping electrode 280 for retaining the substrate 203 below showerhead assembly 230. The electrostatic chuck 266 is driven by a chucking power source 282 to develop an electrostatic force that holds the substrate 203 to the chuck surface, as is conventionally known. Alternatively, the substrate 203 may be retained to the substrate support pedestal assembly 248 by clamping, vacuum or gravity.

At least one of the base 264 or electrostatic chuck 266 may include at least one optional embedded heater 276, at least one optional embedded isolator 274 and a plurality of conduits 268, 270 to control the lateral temperature profile of the substrate support pedestal assembly 248. The conduits 268, 270 are fluidly coupled to a fluid source 272 that circulates a temperature regulating fluid therethrough. The heater 276 is regulated by a power source 278. The conduits 268, 270 and heater 276 are utilized to control the temperature of the base 264, thereby heating and/or cooling the electrostatic chuck 266 and ultimately, the temperature profile of the substrate 203 disposed thereon. The temperature of the electrostatic chuck 266 and the base 264 may be monitored using a plurality of temperature sensors 290, 292. The electrostatic chuck 266 may further comprise a plurality of gas passages (not shown), such as grooves, that are formed in a substrate support pedestal supporting surface of the electrostatic chuck 266 and fluidly coupled to a source of a heat transfer (or backside) gas, such as He. In operation, the backside gas is provided at controlled pressure into the gas passages to enhance the heat transfer between the electrostatic chuck 266 and the substrate 203.

In one implementation, the substrate support pedestal assembly 248 is configured as a cathode and includes an electrode 280 that is coupled to a plurality of RF bias power sources 284, 286. The RF bias power sources 284, 286 are coupled between the electrode 280 disposed in the substrate support pedestal assembly 248 and another electrode, such as the showerhead assembly 230 or ceiling (lid 204) of the chamber body 202. The RF bias power excites and sustains a plasma discharge formed from the gases disposed in the processing region of the chamber body 202.

In the example depicted in FIG. 2, the dual RF bias power sources 284, 286 are coupled to the electrode 280 disposed in the substrate support pedestal assembly 248 through a matching circuit 288. The signal generated by the RF bias power sources 284, 286 is delivered through matching circuit 288 to the substrate support pedestal assembly 248 through a single feed to ionize the gas mixture provided in the plasma processing chamber 200, thereby providing ion energy necessary for performing a deposition or other plasma enhanced process. The RF bias power sources 284, 286 are generally capable of producing an RF signal having a frequency of from about 50 kHz to about 200 MHz and a power between about 0 Watts and about 5000 Watts. An additional bias power source 289 may be coupled to the electrode 280 to control the characteristics of the plasma.

In one mode of operation, the substrate 203 is disposed on the substrate support pedestal assembly 248 in the plasma processing chamber 200. A process gas and/or gas mixture is introduced into the chamber body 202 through the showerhead assembly 230 from the gas panel 258. A vacuum pump system 228 maintains the pressure inside the chamber body 202 while removing deposition by-products.

A controller 250 is coupled to the processing chamber 200 to control operation of the processing chamber 200. The controller 250 includes a central processing unit (CPU) 252, a memory 254, and a support circuit 256 utilized to control the process sequence and regulate the gas flows from the gas panel 258. The CPU 252 may be any form of general purpose computer processor that may be used in an industrial setting. The software routines can be stored in the memory 254, such as random access memory, read only memory, floppy, or hard disk drive, or other form of digital storage. The support circuit 256 is conventionally coupled to the CPU 252 and may include cache, clock circuits, input/output systems, power supplies, and the like. Bi-directional communications between the controller 250 and the various components of the processing chamber 200 are handled through numerous signal cables.

Figure 3:
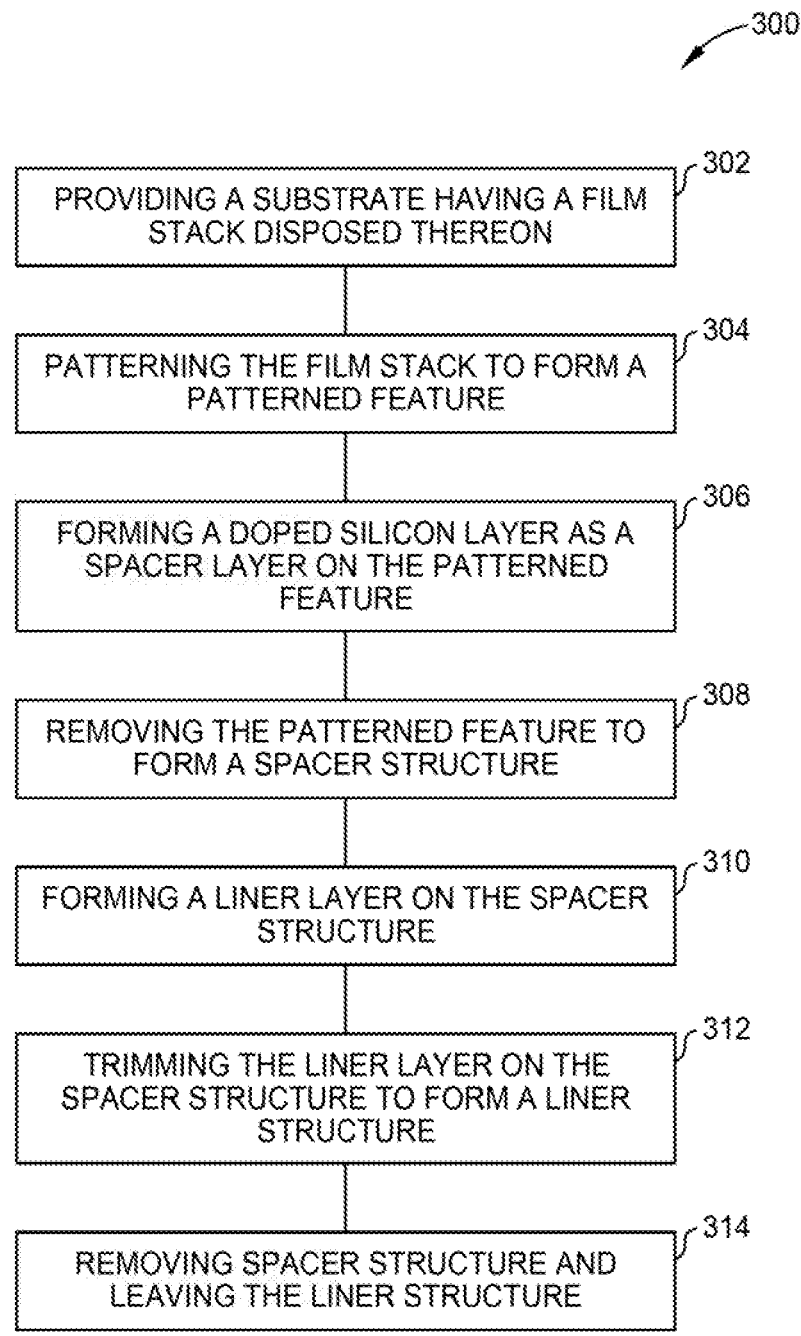
FIG. 3 depicts a flow diagram of a method for performing a patterning process to form nanostructures in accordance with one embodiment of the present disclosure.

FIG. 3 is a flow diagram of one example of a method 300 for manufacturing a nanostructure on a substrate that may be later utilized to serve as an etching mask layer to further transfer features into a material layer disposed on the substrate. FIGS. 4A-4I are cross-sectional views of a portion of a film stack 400 having multiple mask layers corresponding to various stages of the method 300. The method 300 may be utilized to form the nanostructure in a mask layer. The mask layer may be utilized to form features in a material layer, such as a contact dielectric layer, a gate electrode layer, a gate dielectric layer, a STI insulating layer, intermetal layer (IML), or any suitable layers. Alternatively, the method 300 may be beneficially utilized to etch any other types of structures as needed.

The method 300 begins at operation 302 by providing a film stack 400 having a patterned photoresist layer 414 disposed on a hardmask layer 408, which further disposed on a mandrel layer 406 and a bottom layer 404 disposed on a substrate 402, as shown in FIG. 4A. The patterned photoresist layer 414 defined openings 412 therebetween, exposing a portion 416 of the hardmask layer 408 for etching. The mandrel layer 406 and the hardmask layer 408 may later serve as an etching mask to transfer features to a material layer (not shown) under or above the bottom layer 404. The material layer (not shown) formed underneath the mandrel layer 406 and the hardmask layer 408 may have the features formed in the mandrel layer 406 and the hardmask layer 408 transferred into the material layer. In one embodiment, the material layer may be a dielectric layer utilized to form a contact layer, a dual damascene structure, or any suitable materials. Suitable examples of the dielectric layer include carbon-containing silicon oxides (SiOC), polymer materials, such as polyamides, SOG, USG, silicon oxide, silicon nitride, silicon oxynitride, silicon carbide, silicon oxycarbide, or the like.

In one example, the hardmask layer 408 may be a first type of dielectric layer selected from a group consisting of polysilicon, nanocrystalline silicon, amorphous silicon, silicon oxide, silicon nitride, silicon oxynitride, silicon carbide, silicon oxycarbide, amorphous carbon, titanium nitride, titanium oxide, titanium oxynitride, tantalum nitride, tantalum oxide, tantalum oxynitride, or any other suitable materials. In one particular example, the first type of dielectric layer selected to form the first pair of the hardmask layer 408 is silicon containing layer, such as SiON, SiOC, or the like.

The mandrel layer 406 may be any suitable dielectric material different from the hardmask layer 408. In one example, the mandrel layer 406 may be a carbon containing material, such as amorphous carbon, spin-on carbon, or other suitable carbon containing material. In one particular example, the mandrel layer 406 is a spin-on carbon material. In one example, the bottom layer 404 is a dielectric material different from the mandrel layer 406. In one example, the bottom layer 404 is a silicon oxynitride (SiON) material or silicon oxide material.

At operation 304, a series of patterning and trimming processes may be performed to form the patterned hardmask layer 408 with openings 418 formed therein, as shown in FIG. 4B. The patterned photoresist layer 410 may be later removed, as shown in FIG. 4C. In some examples, the photoresist layer 410 may be consumed or removed as well while patterning the hardmask layer 408. Subsequently, the openings 418 defined by the trimmed or patterned hardmask layers 408 formed on the mandrel layer 406 may have a pitch different (e.g., smaller) from the pitch defined by the openings 412 defined by the patterned photoresist layer 414. After the patterned hardmask layer 408 is formed, another patterning/etching process is performed to remove a portion of the mandrel layer 406 exposed by the patterned hardmask layer 408, forming openings 424 in the mandrel layer 406, as shown in FIG. 4D. It is believed that trimming the hardmask layer 408 and patterning the mandrel layer 406 prior to forming the a spacer layer (which will be performed at operation 306) may provide a good profile, relatively vertical sidewalls, desired square corners and with even spacing from the mandrel 406 so as to provide a desired straight sidewall and top surface profile that allows the following spacer layer to conformally formed thereon with uniform thickness as needed.

At operation 306, after a surface 422 of the bottom layer 404 is exposed, a spacer layer 430 is then formed on the patterned mandrel layer 406, as shown in FIG. 4E. In one example, the spacer layer 430 is a doped silicon containing layer, such as boron doped silicon material, phosphorus doped silicon, or other suitable group III, group IV or group V doped silicon material. In one example, the spacer layer 430 is a boron doped silicon layer.

In one embodiment, the spacer layer 430 is formed in the CVD chamber, such as the CVD processing chamber 100 depicted in FIG. 1. It is noted that the spacer layer 430 may be formed by any suitable deposition processes, such as PECVD, ALD, SACVD, HDPCVD, spin-on coating, or other suitable deposition techniques. In one example, the spacer layer 430 has a thickness between about 5 nm and about 25 nm.

In one example, the spacer layer 430 is conformally formed on the mandrel layer 406, conformally lining on the top surface 432 and the sidewalls 434 of the mandrel layer 406. It is believed that the spacer layer 430 fabricated from the doped silicon layer, such as a boron doped silicon material, may provide good etching selectivity during the subsequent patterning process, so that a good profile of the spacer layer 430 after the patterning process may be obtained as needed.

It is believed that doped silicon containing material, such as a boron doped silicon material, may be deposited at a temperature less than a temperature often used to deposit a silicon containing material, such as non-doped amorphous silicon. In some conventional practices, as the spacer layer 430 formed from a conventional CVD process often requires to utilize a deposition temperature greater than 400 degrees Celsius. In contrast, the doped silicon material, such as the boron doped silicon material as disclosed herein, may be formed by a CVD process with a deposition temperature less than 250 degrees Celsius, such as less than 220 degrees Celsius, such as between about 150 degrees Celsius and about 200 degrees Celsius. The relatively low deposition for the doped silicon material provides wider process windows during the subsequent etching/patterning processes. Furthermore, more variations and types of the materials for the nearby materials, such as the mandrel layer 406, may also be selected. For example, the low deposition process temperature allows the mandrel layer 406, where the spacer layer 430 is in contact with, to be fabricated from a material that can undergo process a temperature up to 250 degrees Celsius without substantial material alternation, film distortion, thermal decomposition (either chemically or physically) and different types of changes. As a result, some types of carbon materials, polymer materials, organic material, or photoresist materials that often can sustain a temperature less than 250 degrees Celsius, such as above 100 degrees Celsius but less than 250 degrees Celsius, may be selected for the mandrel layer 406, which may enhance the etching selectivity during the subsequent patterning process at operation 308. Furthermore, the relatively low temperature deposition process for the spacer layer 430 also provides minimum micro-loading effect as well.

At operation 308, a patterning process is performed to remove the mandrel layer 406, as shown in FIG. 4F, forming a spacer structure 431 from the spacer layer 430. The patterning process may be performed at an etching chamber, such as the processing chamber depicted in FIG. 2. The patterning process is performed by supplying a first gas mixture that may selectively remove the spacer layer 430 and the mandrel layer 406 with a desired directionality so that certain portions (e.g., sidewalls 434) of the spacer layer 430 may remain on the substrate with a desired profile to form the spacer structure 431. In one example, the first gas mixture supplied during the patterning process may include reactive etchants utilized for anisotropic etching a silicon containing material from the spacer layer 430, particularly, to anisotropicly etch a doped silicon containing material.

In one example, the first gas mixture includes a halogen containing gas selected from a group consisting of HBr, chlorine gas ($Cl_2$), nitrogen trifluoride ($NF_3$), sulfur hexafluoride gas ($SF_6$), carbon and fluorine containing gas, such as $CF_4$, $CHF_3$, $C_4F_8$ and the like. In one particular example, the first gas mixture includes HBr and chlorine gas ($Cl_2$) utilized to etch the spacer layer 430. The first gas mixture is configured to remove the top portion and bottom portion of the spacer layer 430 without significantly attacking the sidewalls 434 of the spacer layer 430. In one example, the etching of the spacer layer 430 results in a substantially square top surface of the spacer structure 431.

Several process parameters are regulated while the first gas mixture supplied into the etch chamber. In one embodiment, the chamber pressure in the presence of the first gas mixture is regulated. In one exemplary embodiment, a process pressure in the etch chamber is regulated between about 2 mTorr to about 2000 mTorr, for example, between about 100 mTorr and about 800 mTorr. RF source and bias power may be applied to maintain a plasma formed from the first gas mixture. For example, a RF source power of between about 100 Watts to about 1500 Watts, such as between 200 Watts and about 800 Watts, may be applied to an inductively coupled antenna source to maintain a plasma inside the etch chamber. A RF bias power of about less than 200 Watts, such as between about 150 Watts and about 40 Watts, are applied while supplying the first gas mixture. The first gas mixture may be flowed into the chamber at a rate between about 50 sccm to about 1000 sccm. A substrate temperature is maintained between about –20 degrees Celsius to about 80 degrees Celsius.

While supplying the first gas mixture, the RF source and bias power range may be varied to facilitate predominately removing certain portions of the spacer layer 430. For example, the RF source power may be turned up (e.g., from a first RF source power setting to a second RF source power setting) while the RF bias power may be turned down (e.g., from a first RF bias power setting to a second RF bias power setting) as needed while supplying the first gas mixture. In one example, after the first RF source and bias power setting has been performed for a time period for between about 5 seconds and about 20 seconds, the a first RF source and bias power settings may be transitioned to the second RF source and bias power setting to continue the patterning process. In one example, the second RF source power setting is between about 30% and about 80% higher than the first RF source power setting. The second bias power setting is between about 30 percent and about 70 percent less than the first bias power setting.

In one particular example, the first RF source power setting is between about 500 Watts and about 600 Watts and the first RF bias power setting is between about 50 Watts and about 150 Watts. The second RF source power setting is between about 700 Watts and about 900 Watts and the second RF bias power setting is between about 20 Watts and about 100 Watts.

In one example, the patterning process may include one or more processing stages. For example, after the first gas mixture is supplied to predominately remove the top portion and the bottom portion (e.g., the portion above the bottom layer 404), a second gas mixture is supplied to predominately remove the mandrel layer 406. The second gas mixture includes an oxygen containing gas mixture and/or a carrier gas, such as $N_2$, He, Ar and the like. In one example, a carbon and fluorine containing gas, such as $CH_2F_2$, $CF_4$, and the like may also be utilized as needed. In one particular example, the second gas mixture includes $O_2$ and $N_2$ or $O_2$, $N_2$ and $CH_2F_2$.

Several process parameters are regulated while the second gas mixture supplied into the etch chamber. In one embodiment, the chamber pressure in the presence of the second gas mixture is regulated. In one exemplary embodiment, a process pressure in the etch chamber is regulated between about 2 mTorr to about 2000 mTorr, for example, between about 100 mTorr and about 800 mTorr. RF source and bias power may be applied to maintain a plasma formed from the first gas mixture. For example, a RF source power of between about 100 Watts to about 1500 Watts, such as between 500 Watts and about 1500 Watts, may be applied to an inductively coupled antenna source to maintain a plasma inside the etch chamber. A RF bias power of about less than 200 Watts, such as between about 150 Watts and about 40 Watts, are applied while supplying the second gas mixture. The RF bias power applied while supplying the second gas mixture is similar to the first and the second bias power settings applied while supplying the first gas mixture. In some examples, the RF source power applied while supplying the second gas mixture is greater than to the first and the second source power settings applied while supplying the first gas mixture. The second gas mixture may be flowed into the chamber at a rate between about 50 sccm to about 1000 sccm. A substrate temperature is maintained between about –20 degrees Celsius to about 80 degrees Celsius.

At operation 310, a liner layer 440 may be formed on the spacer structure 431, as shown in FIG. 4G. The liner layer 440 may also be seemed as another spacer layer (e.g., a spacer-on-spacer scheme) that assists reducing dimensions of the openings as defined therebetween with reduced dimensions as needed. The liner layer 440 may be any suitable oxide containing material formed by CVD, ALD, spin coating, or any suitable deposition techniques. In one example, the liner layer 440 is a silicon oxide layer formed by an ALD process. It is noted that the liner layer 440 as formed here is conformally formed on the spacer structure 431, conformally lining on the top surface 438 and the sidewalls 434 of the spacer structure 431. The liner layer 440 further reduce the dimension of the openings 424 defined between the spacer structures 431, which may be further utilized as a mask layer to transfer features to the underlying layers with reduced small dimension as needed.

At operation 312, another patterning process is performed to remove a portion of the liner layer 440 from the substrate, as shown in FIG. 4H. The portion of the liner layer 440 being removed from the substrate includes the liner layer 440 formed on the top surface 438 of the spacer structure 431 and on the surface 422 of the bottom layer 404. The liner layer 440 undergoes anisotropic etching or patterning until a top surface 438 of the spacer structure 431 is exposed, leaving the liner layer 440 having a sidewall portion 448 lining on the spacer structure 431. The patterning process may be similar to the patterning process performed at operation 308. In one example, operation 312 results in the top surface 438 of the spacer structure 431 being substantially square.

At operation 314, after the top surface 446 of the spacer structure 431 is exposed, an etching process is performed to remove the spacer structure 431 from the substrate, as shown in FIG. 4I, forming openings 450 with desired dimension between the liner layer 440. The openings 450 exposes a top surface 442 of the bottom layer 404. The liner layer 440 may be later utilized as a mask layer that may facilitate transferring features into the underlying layers and/or structures. As shown in FIG. 4I, the liner layer 440 formed on the substrate 402 has a desired profile with vertical sidewalls and minimum footing, facet, or other undesired defects. By utilizing the material property difference between the spacer structure 431 and the liner layer 440 (e.g., a doped silicon material v.s. a silicon oxide material) and the mandrel layer 406, a high etching selectivity may be obtained, thus providing a smooth and minimum line roughness of the liner layer 440 on the substrate as a hardmask for the following patterning process. The patterning process may be similar to the patterning process performed at operation 308.

Furthermore, FIGS. 5A-5G depicts similar process flow with different film stack structures to form a liner layer as a mask layer for transferring features to the underlying structures during patterning processes, which may also utilize the process sequences of method 300 of FIG. 3. Similarly, at operation 302, a film stack 500 includes a mandrel layer 506 disposed on the bottom layer 404, as shown in FIG. 5A. The mandrel layer 506 in this example may be a photoresist material. The photoresist material as selected for the mandrel layer 506 may be an organic material that may be sustained under a thermal process up to 200 degrees Celsius without substantial thermal and/or chemical decomposition. The relatively high thermal resistance for the mandrel layer 506 may allow the subsequent spacer layer deposition to be performed on the mandrel layer 506 without decomposition or damage so that allows the spacer layer to be formed on the mandrel layer 506 using a CVD process having a process temperature greater than 150 degrees Celsius.

At operation 304, the mandrel layer 506 may be trimmed, such as by anisotropic etching, to reduce the dimension of the mandrel layer 506 from the first dimension 508 to a second reduced dimension 512, as shown in FIG. 5B.

At operation 306, a spacer deposition process is performed to form a spacer layer 524 on the mandrel layer 506, as shown in FIG. 5C. The spacer layer 524 includes a top portion 530 formed on a top surface 518 of the mandrel layer 506 and a sidewall 514 formed on the sidewalls of the mandrel layer 506. As discussed above, the spacer layer 524 may be similar to or the same as the spacer layer 430 described above formed from doped silicon containing material by a CVD process.

At operation 308, the mandrel layer 506 is removed from the substrate 402 and a spacer structure 521 is formed from the sidewall 514 of the spacer layer 524, as shown in FIG. 5D. As discussed above, as the mandrel layer 506 is formed by a photoresist material, an oxygen containing gas and/or with a carrier gas, such as $N_2$, He, Ar, is utilized to remove the mandrel layer 506. In one example, a carbon and fluorine containing gas, such as $CH_2F_2$, $CF_4$, and the like may be also utilized as needed. In one particular example, the second gas mixture includes $O_2$ and $N_2$ or $O_2$, $N_2$ and $CH_2F_2$.

Several process parameters are regulated while the oxygen containing gas and/or with the carrier gas are supplied into the etch chamber. In one embodiment, the chamber pressure in the presence of the oxygen containing gas and/or with the carrier gas is regulated. In one exemplary embodiment, a process pressure in the etch chamber is regulated between about 2 mTorr to about 2000 mTorr, for example, between about 100 mTorr and about 800 mTorr. RF source and bias power may be applied to maintain a plasma formed from the first gas mixture. For example, a RF source power of between about 100 Watts to about 1500 Watts, such as between about 500 Watts and about 1500 Watts, may be applied to an inductively coupled antenna source to maintain a plasma inside the etch chamber. A RF bias power of about less than 200 Watts, such as between about 150 Watts and about 40 Watts, are applied while supplying the oxygen containing gas and/or with the carrier gas. The oxygen containing gas and/or with the carrier gas may be flowed into the chamber at a rate between about 50 sccm to about 1000 sccm. A substrate temperature is maintained between about −20 degrees Celsius to about 80 degrees Celsius.

At operation 310, a liner layer 522 is formed on the spacer structure 521, as shown in FIG. 5E. The liner layer 522 may also be seemed as another spacer layer (e.g., a space-on-spacer scheme) that assists reducing dimensions of the openings as defined therebetween with reduced dimensions as needed. The liner layer 522 is conformally formed on the spacer structure 521. Similar to the liner layer 440 described above, the liner layer 552 is a silicon oxide layer formed by any suitable deposition processes, such as CVD, ALD, and the like.

At operation 312, similarly, the liner layer 522 is then patterned, trimmed, or anisotropicly etched to expose a top surface 530 of the spacer structure 521, e.g., the remaining sidewalls 514 of the spacer layer 516. The patterning process may be similar to the patterning process performed at operation 308.

At operation 314, after the liner layer 522 is trimmed and the top surface 530 of the spacer structure 521 is exposed, a patterning process may be performed to selectively remove the spacer structure 521 until a top surface 520 of the bottom layer 404 is exposed, leaving the liner layer 522 on the substrate 402 as a mask layer for the following patterning process. The patterning process may have high etching selectivity between the liner layer 522 and the spacer structure 521, forming an opening 544 among the liner layer 522 with the desired dimensions. The patterning process may be similar to the patterning process performed at operation 308.

Figure 6A:
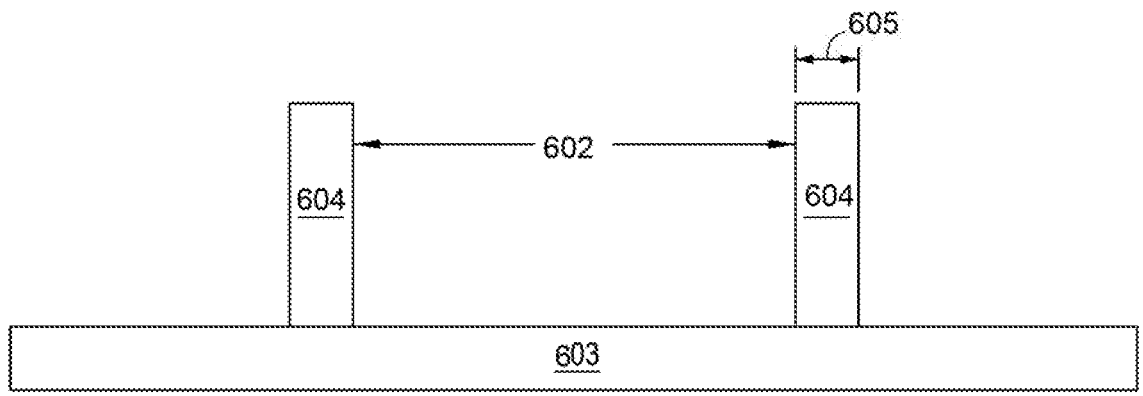
FIGS. 6A-6F depict another example of cross sectional views of a sequence for forming a nanostructure by utilizing a spacer layer utilized in the method of FIG. 3 in accordance with one embodiment of the present disclosure.

FIGS. 6A-6F depict another example of cross sectional views of a sequence for forming a nanostructure by a multiple patterning process utilizing the spacer layer 430, 516 and/or the liner layer 440, 552 as described above. The spacer layer 430, 516 is fabricated by a doped silicon containing material, such as a boron doped silicon layer. In the example depicted in FIGS. 6A-6F, a first pair of mask layers 604 (e.g., maybe similar to the spacer layer 430, 516 and/or the liner layer 440, 552 described above) is formed on a base layer 603 defining a pitch 602 therebetween, as shown in FIG. 6A. The pitch 602 may be configured to have a width between about 50 nm and about 150 nm, such as about 60 nm and about 90 nm, for example about 80 nm. The first pair of the mask layer 604 may define a first dimension 605. This step may require one lithographic exposure process and one etching/trimming process, such as anisotropic etching, to form the patterned first pair of mask layer 604 on the base layer 603. In one example, the first pair of the mask layer 604 may be fabricated by suitable dielectric materials as needed. In one example, the first pair of the mask layer 604 may be formed by a doped silicon containing material, such as a boron doped silicon material, similar to the materials utilized to form the spacer layer 430, 516 described above.

Figure 6B:
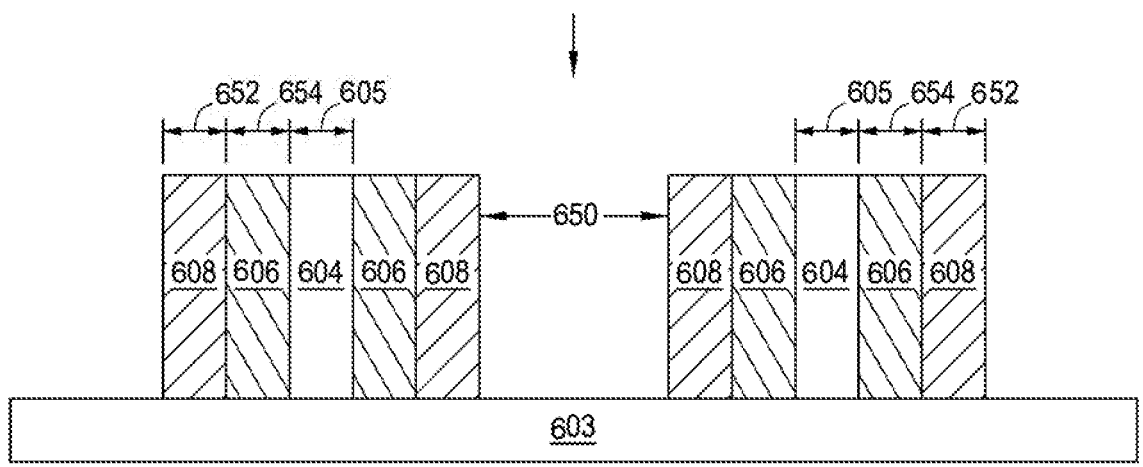

Subsequently, a second pair and a third pair of mask layers 606, 608, (e.g., maybe similar to the spacer layer 430, 516 and/or the liner layer 440, 552 described above) is formed on the base layer 603, as shown in FIG. 6B. The second and third pair of the mask layers 606, 608 may each define a second dimension 654 and a third dimension 652. The second and the third dimension 654, 652 are configured to have substantially similar width. Similarly, this process may require two cycles of deposition (ALD) processes and etching processes to fulfill. In one example, the second pair and a third pair of mask layers 606, 608 may be fabricated by suitable dielectric materials as needed. Similarly, the second and third pair of the mask layer 606, 608 may be formed by a doped silicon containing material, such as a boron doped silicon material, similar to the materials utilized to form the spacer layer 430, 516 described above.

Figure 6C:
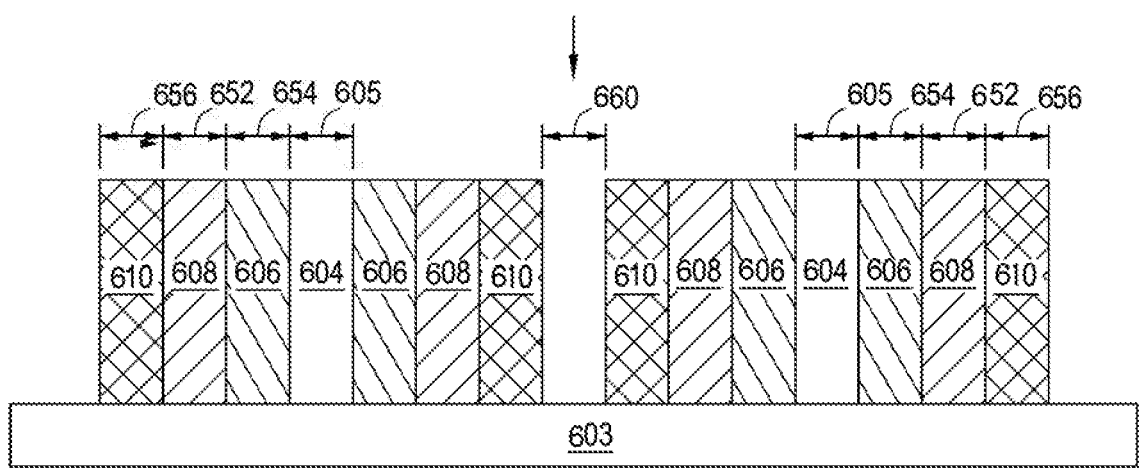

In addition, a third cycle of deposition (ALD) processes and etching processes may be performed to form a fourth pair of mask layers 610 (e.g., maybe similar to the spacer layer 430, 516 and/or the liner layer 440, 552 described above) to further reduce the pitch 650 to the narrower pitch 660, as shown in FIG. 6C. By now, the pitch 660 may be shrank to about less than 15 nm, such as about 10 nm. The fourth pair of mask layer 610 may define a fourth dimension 656, similar to the first, second and third dimension 605, 654, 652 defined by other mask layers 604, 606, 608. In one example, the fourth pair of mask layers 610 may be fabricated by suitable dielectric materials as needed. Similarly, the fourth pair of mask layers 610 may be formed by a doped silicon containing material, such as a boron doped silicon material, similar to the materials utilized to form the spacer layer 430, 516 described above.

Figure 6D:
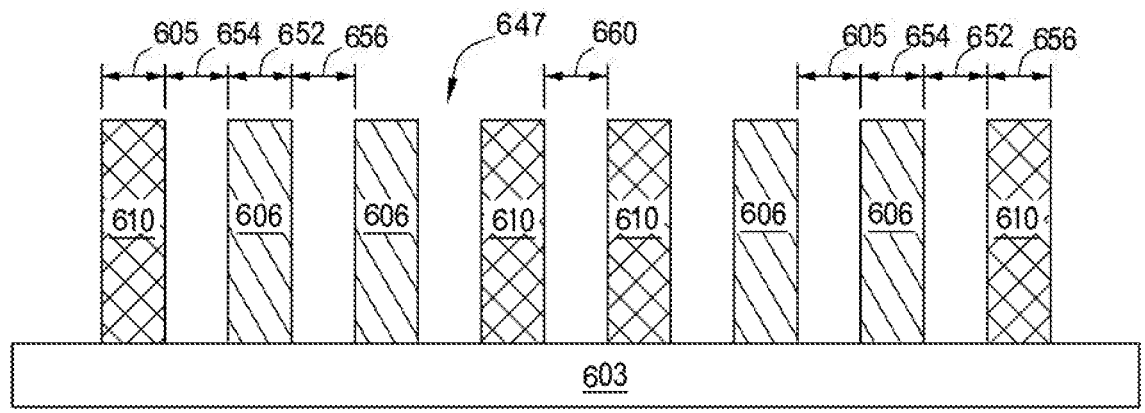

As the pitch 660 and the dimensions 605, 654, 652, 656 has all reached down to a desired level, an etching process may be performed to selectively removing a portion of the mask layer, such as the first and the third pairs of the mask layers 604, 608, as shown in FIG. 6D, creating openings 647 with equal widths 652, 605 among the mask layers 606, 610 remained on the base layer 603. An additional etching process is required to selectively remove the first pair of the mask layers 604 and the third pair of the mask layers 608 from the base layer 603. (1L).

Figure 6E:
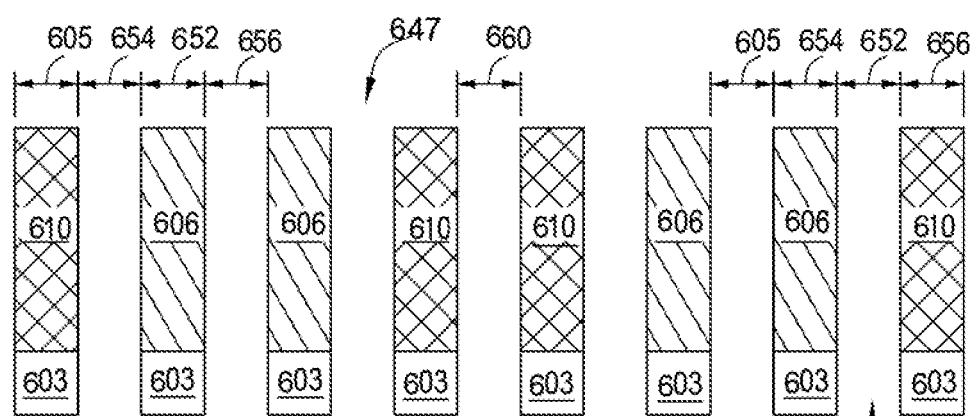
Figure 6F:
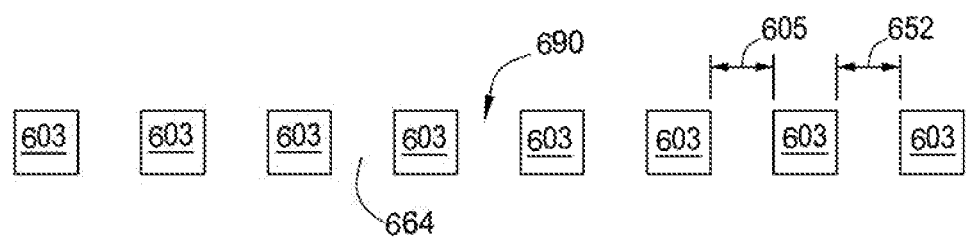

After the opening 647 is defined, a final etching stop is performed to etch the base layer 606 to form openings 690 in the base layer 603, as shown in FIG. 6E. Subsequently, the remaining mask layers 606, 610 is then removed, leaving the base layer 603 with openings 664 with dimensions 605, 652 as an etch mask for later etching process, as shown in FIG. 6F.

It is noted that each pair of the mask layers may be fabricated by different materials so as to enhance the etching selectivity therebetween. As described above, suitable materials, including amorphous silicon material, polysilicon material, amorphous carbon materials, organic materials, photoresist layer, silicon oxide material, doped silicon material, such as boron doped silicon material described above at operation 306, and the like may be utilized as needed to enhance the etching profile as needed.

It is noted that although the example described in FIGS. 6A-6F is a triple spacer patterning (SATSP) process, it is noted that the materials selected for spacer layer 430, 516, such as a doped silicon containing material, may be utilized in any suitable patterning process having any numbers of spacer deposition and patterning processes.

Thus, methods for multiple spacer patterning processes to transfer features with small dimensions to a mask layer are provided. The multiple spacer patterning process utilizes a high etching selectivity between a spacer layer and a liner layer so that a desired profile of liner layer and/or spacer layer may be obtained, which may be utilized as mask layer that facilitates the nano-dimension feature transfer process.

While the foregoing is directed to embodiments of the present disclosure, other and further embodiments of the disclosure may be devised without departing from the basic scope thereof, and the scope thereof is determined by the claims that follow.

What is claimed is:

1. A method for forming features on a substrate comprising:
   forming a mandrel layer on a substrate;
   conformally forming a spacer layer on the mandrel layer, wherein the spacer layer is a doped silicon material; and
   patterning the spacer layer, wherein the patterned spacer layer has vertically straight sidewalls and a flat top surface, and wherein square corners connect the vertically straight sidewalls and the flattop surface, wherein patterning the spacer layer comprises:
   supplying a first gas mixture comprising a halogen containing gas;
   applying a first RF source power setting in the first gas mixture
   switching the first RF source power setting to a second RF source power setting while supplying the first gas mixture;
   supplying a second gas mixture, wherein the second gas mixture comprises an oxygen containing gas; and
   applying a third RF source power setting while supplying the second gas mixture, wherein the third RF source power setting is greater than the first RF source power setting and the second RF source power setting while supplying the first gas mixture.

2. The method of claim 1, further comprising:
   switching the first RF source power setting to a second RF source power setting while supplying the first gas mixture, wherein the second RF source power setting is greater than the first RF source power setting.

3. The method of claim 1, further comprising:
   applying a first RF bias power setting in the first gas mixture; and
   switching the first RF bias power setting to a second RF bias power setting while supplying the first gas mixture, wherein the second RF bias power setting is less than the first RF bias power setting.

4. The method of claim 1, wherein the second gas mixture further comprises a carbon fluorine containing gas.

5. The method of claim 1, wherein the first gas mixture further comprises $Cl_2$ gas and HBr gas.

6. The method of claim 1, wherein the doped silicon material of the spacer layer is selected from a group consisting of group III, group IV or group V doped silicon material.

7. The method of claim 1, wherein the doped silicon material of the spacer layer is a boron doped silicon material.

8. The method of claim 1, wherein the mandrel layer comprises a photoresist layer formed from an organic material.

9. The method of claim 8, wherein the organic material from the photoresist layer of the mandrel layer sustains under a thermal process up to 200 degrees Celsius.

10. The method of claim 1, further comprising:
    forming a liner layer on the patterned spacer layer, wherein the liner layer is fabricated from a material different from the spacer layer.

11. The method of claim 10, wherein the liner layer is a silicon oxide layer.

12. The method of claim 10, further comprising:
    selectively removing the patterned spacer layer from the substrate.

13. A method for forming features on a substrate comprising:
conformally forming a spacer layer on a mandrel layer on a substrate, wherein the spacer layer is a doped silicon material;
selectively removing a portion of the spacer layer using a first gas mixture, wherein selectively removing the portion of the spacer layer further comprising:
applying a first RF source power setting while supplying the first gas mixture; and
subsequently applying a second RF source power setting different from the first RF source power while continuing supplying the first gas mixture wherein the second RF source power setting is between about 30 percent and about 80 percent higher than the first RF source power setting;
applying a first RF bias power setting while supplying the first gas mixture; and
subsequently applying a second RF bias power setting different from the first RF bias power while continuing supplying the first gas mixture, wherein the second bias power setting is between about 30 percent and about 70 percent less than the first bias power setting; and
selectively removing the mandrel layer using a second gas mixture different from the first gas mixture, wherein after selectively removing the mandrel layer the spacer layer has vertically straight sidewalls and a flat top surface, and wherein square corners connect the vertically straight sidewalls and the flat top surface.

14. A method for forming features on a substrate comprising:
conformally forming a spacer layer on a mandrel layer on a substrate, wherein the spacer layer is a doped silicon material, wherein the mandrel layer is fabricated from an organic material that sustains under a thermal process up to 200 degrees Celsius;
selectively removing the mandrel layer and a portion of the spacer layer using a first gas mixture wherein after selectively removing the mandrel layer the spacer layer has vertically straight sidewalls and a flattop surface;
conformally forming a liner layer on the spacer; and
selectively removing a portion of the liner layer using a second gas mixture different from the first gas mixture, wherein after selectively removing the liner layer the spacer layer has the vertically straight sidewalls and the flattop surface.

* * * * *

UNITED STATES PATENT AND TRADEMARK OFFICE
CERTIFICATE OF CORRECTION

| | |
|---|---|
| PATENT NO. | : 11,315,787 B2 |
| APPLICATION NO. | : 16/821759 |
| DATED | : April 26, 2022 |
| INVENTOR(S) | : Yang et al. |

It is certified that error appears in the above-identified patent and that said Letters Patent is hereby corrected as shown below:

In the Specification

In Column 5, Line 2, delete "sillyl" and insert -- silyl --.

In Column 5, Line 3, delete "trisillylamine" and insert -- trisilylamine --.

In Column 5, Line 3, delete "disillylamine" and insert -- disilylamine --.

In Column 6, Line 46, delete "$C_{12}$, $CC_{14}$," and insert -- $Cl_2$, $CCl_4$, --.

In Column 6, Line 46, delete "$CH_2C_{12}$," and insert -- $CH_2Cl_2$, --.

In Column 9, Line 56, delete "the a" and insert -- the --.

In Column 11, Line 44, delete "the a" and insert -- the --.

In the Claims

In Column 16, Line 11 (Approx.), in Claim 1, delete "flattop" and insert -- flat top --.

In Column 18, Line 17, in Claim 14, delete "flattop" and insert -- flat top --.

In Column 18, Line 23, in Claim 14, delete "flattop" and insert -- flat top --.

Signed and Sealed this
Eighteenth Day of October, 2022

Katherine Kelly Vidal
*Director of the United States Patent and Trademark Office*